(12) United States Patent
Hsieh et al.

(10) Patent No.: US 10,685,852 B2
(45) Date of Patent: Jun. 16, 2020

(54) CHIP PACKAGING DEVICE AND ALIGNMENT BONDING METHOD THEREOF

(71) Applicant: National Cheng Kung University, Tainan (TW)

(72) Inventors: Po-Tsung Hsieh, Tainan (TW); Chia-Ming Yang, Tainan (TW); In-Gann Chen, Tainan (TW); Shih-Wen Tseng, Tainan (TW); Ya-Wen Tsai, Tainan (TW); Ya-Wen Chuang, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 16/199,668

(22) Filed: Nov. 26, 2018

(65) Prior Publication Data

US 2020/0144078 A1    May 7, 2020

(30) Foreign Application Priority Data

Nov. 7, 2018    (TW) .............................. 107139544 A

(51) Int. Cl.
| | | |
|---|---|---|
| *H01L 21/68* | (2006.01) | |
| *H01L 21/50* | (2006.01) | |
| *H01L 23/00* | (2006.01) | |
| *H01L 21/66* | (2006.01) | |
| *H01L 21/67* | (2006.01) | |

(52) U.S. Cl.
CPC .......... *H01L 21/50* (2013.01); *H01L 21/6715* (2013.01); *H01L 21/67121* (2013.01); *H01L 21/67126* (2013.01); *H01L 21/681* (2013.01); *H01L 22/24* (2013.01); *H01L 24/95* (2013.01)

(58) Field of Classification Search
CPC ............... H01L 21/50; H01L 21/67121; H01L 21/67126; H01L 21/6715; H01L 21/68–681
See application file for complete search history.

(56) References Cited

U.S. PATENT DOCUMENTS

2018/0250670 A1*    9/2018    Le Berre ............... B01L 3/5088

\* cited by examiner

*Primary Examiner* — Selim U Ahmed
*Assistant Examiner* — Evan G Clinton
(74) *Attorney, Agent, or Firm* — WPAT, PC

(57) ABSTRACT

A chip packaging device is provided, which includes a main body unit, packaging unit and an aligning unit. The main body unit includes a mounting base, holder and a rotational platform. The packaging unit includes upper and lower bonding elements, upper and lower chips and a mask; a vertical axis is at the middle of the upper and the lower bonding elements, and a horizontal axis is above the lower bonding element. The aligning unit includes an aligning detector and a first focusing detector. When the lower chip and the mask are disposed on the lower bonding element, place the liquid sample in the mask and spread a packaging adhesive over the surface thereof; then, remove the mask and use the aligning detector and the first focusing detector to detect the position of the lower chip respectively, such that the chips can be aligned and bonded with each other.

5 Claims, 5 Drawing Sheets

CHIP PACKAGING DEVICE AND ALIGNMENT BONDING METHOD THEREOF

BACKGROUND OF THE INVENTION

1. Field of the Invention

The present invention relates to a chip packaging device, in particular to a chip packaging device and an alignment bonding method applicable to package a liquid sample.

2. Description of the Prior Art

Electron microscopes are comprehensively applied to inspect samples in various fields. When inspecting a liquid sample, it is necessary to package the liquid sample because of several problems; for example, the liquid sample is of fluidity or the chamber may be contaminated during the operation process. For instance, when packaging a liquid sample by combining the semi-conductor manufacturing process and the MEMS technology, the above method can only be applied to liquid samples with high fluidity because the electron beam is of low penetrability and the imaging is difficult for electron microscopes. Accordingly, the above method cannot be applied to liquid samples with low fluidity or high viscosity.

Moreover, regarding the mounting devices for mounting the samples for the method of combining semi-conductor manufacturing process and the MEMS technology, the mounting devices should be placed under the optical microscope during the packaging process; then, the upper mounting device and the lower mounting device should be aligned via visual inspection by using the optical microscope for bonding, which not only wastes a lot of time, but also decreases the yield rate because of proficiency, stability and other man-made factors. If the liquid samples are dried in order to decrease the fluidity of the liquid samples, the deformation or other form changing problems of the liquid samples will be incurred. Besides, the conventional air-driven or pressure-driven adhesive spraying system may be difficult to spray the adhesive when the viscosity of the adhesive is more than 100 cp (centi-poise).

The above shortcomings clearly show there are various problems incurred during the inspecting and packaging the liquid samples; thus, it has become an important issue to provide a simple, swift and precise mounting device and aligning method to directly package the liquid samples, in particular to spreading the high-viscosity adhesive with low fluidity so as to keep the original form of the liquid samples.

SUMMARY OF THE INVENTION

To achieve the foregoing objective, the present invention provides a chip packaging device, applicable to packaging a liquid sample, which includes a main body unit, a packaging unit and an aligning unit.

The main body unit includes a mounting base, a holder disposed above the mounting base and a rotational platform connected to the holder; a horizontal axis and a vertical axis orthogonal to the horizontal axis are defined in the mounting base. The packaging unit includes an upper bonding element connected to the rotational platform, a lower bonding element arranged in a regular interval and opposite to the upper bonding element, an upper chip detachably disposed on one end of the upper bonding element, a lower chip detachably disposed on one end of the lower bonding element and a mask detachably disposed between the upper chip and the lower chip; the vertical axis is at the middle of the upper bonding element and the lower bonding element, and the horizontal axis is above the lower bonding element. The aligning unit includes an aligning detector disposed at the middle of the upper bonding element and above the vertical axis, and a first focusing detector disposed on the mounting base and the horizontal axis.

In one embodiment of the present invention, the aligning unit further includes a second focusing detector disposed on the mounting base and the horizontal axis, and the first focusing detector and the second focusing detector are arranged to have the included angle equal to 90° therebetween.

In one embodiment of the present invention, the main body unit further includes a sliding platform disposed on the rotational platform to connect to the upper bonding element; the sliding platform moves to drive the upper bonding element to slide along the x-axis or the y-axis; the aligning unit further includes a processor connected to the aligning detector, the first focusing detector, the second focusing detector and the sliding platform; when the aligning detector, the first focusing detector and the second focusing detector are used to detect the position of the lower chip respectively, the aligning detector transmits a position signal to the processor and the processor controls the sliding platform according to the position signal; the first focusing detector and the second focusing detector transmits an image signal to the processor respectively for a focusing operation, and the processor controls the sliding platform to move according to a result of the focusing operation in order to align and bond the upper chip and the lower chip with each other.

In one embodiment of the present invention, the mask includes a main body, a placing hole, a spreading channel surrounding the placing hole and arranged in a regular interval therewith, and at least one connecting rid connecting the spreading channel to the main body; when the lower chip and the mask are disposed on the lower bonding element, the liquid sample is in the placing hole, the packaging adhesive is spread in the spreading channel and the upper chip is pressed on the mask.

In one embodiment of the present invention, the packaging unit further includes an adhesive spreading can connected to the rotational platform and disposed at one side of the upper bonding element; the adhesive spreading can contains the packaging adhesive for packaging the upper chip and the lower chip.

To achieve the foregoing objective, the present invention further provides an alignment bonding method for chip packaging device, which includes the following steps:

First, disposing a lower chip and a mask on a lower bonding element; then, rotating a rotational platform to make an adhesive spreading can be above a lower bonding element, placing the liquid sample in the placing hole of the mask and spreading a packaging adhesive over the spreading channel of the mask; finally, removing the mask an rotating the rotational platform, disposing an upper chip on an upper bonding element, and making the upper bonding element be above the lower bonding element in order to align and bond the upper chip and the lower chip, wherein the process of aligning and bonding includes using an aligning detector to detect the position of the lower chip and transmitting a position signal to a processor; the processor controls a sliding platform to move according to the position signal, and a first focusing detector and a second focusing detector detect the position of the chip in two directions respectively, and then transmit an image signal to the processor respectively for a focusing operation; the processor controls the sliding platform to move according to the result of the focusing operation.

In one embodiment of the present invention, the bonding pressure of the upper chip and the lower chip is lower than 1 KPA and the bonding time thereof is lower than 10 minutes and the bonding temperature thereof is lower than 100°.

In one embodiment of the present invention, the height of the pattern of the packaging adhesive between the upper chip and the lower chip is between 1000~1 um (Micrometer), the diameter thereof is between 1000~10 um and an average thickness difference thereof is lower than 50%.

In one embodiment of the present invention, the viscosity of the liquid sample is between 100~1,000,000 cp (centipoise).

In one embodiment of the present invention, the liquid sample is placed in the placing hole of the mask first and then the packaging adhesive is spread over the spreading channel of the mask.

The technical effect of the present invention is that when the lower chip and the mask are disposed on the upper bonding element, place the liquid sample in the mask and spread a packaging adhesive over a surface of the liquid sample; then, remove the mask, and use the aligning detector and the first focusing detector to detect the position of the lower chip respectively, such that the upper chip and the lower chip are aligned and bonded with each other; during the above process, the aligning detector and the first focusing detector can perform the position detection and obtain multi-dimensional view angle image in order to achieve precise alignment.

BRIEF DESCRIPTION OF THE DRAWINGS

For a better understanding of the aforementioned embodiments of the invention as well as additional embodiments thereof, reference should be made to the Description of Embodiments below, in conjunction with the following drawings in which like reference numerals refer to corresponding parts throughout the figures.

DETAILED DESCRIPTION OF THE PREFERRED EMBODIMENT

The following description is about embodiments of the present invention; however it is not intended to limit the scope of the present invention.

Figure 1:
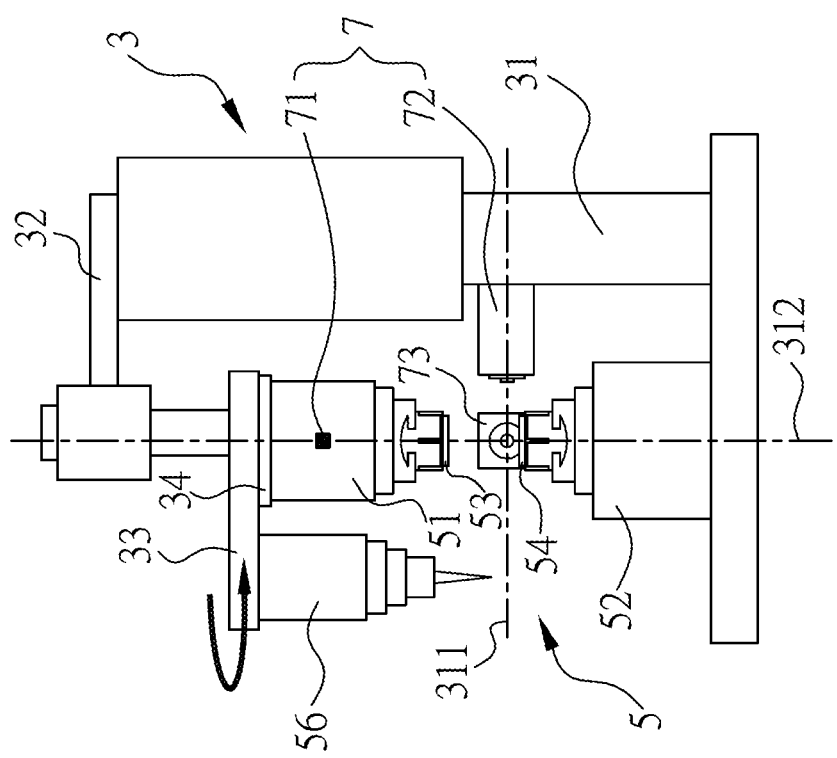
FIG. 1 is a lateral view of a preferred embodiment of a chip packaging device in accordance with the present invention.
Figure 2:
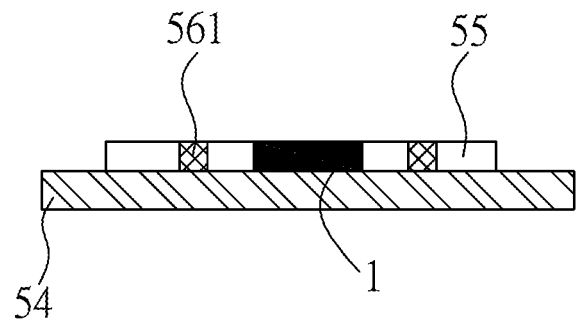
FIG. 2 is a cross-section view of a preferred embodiment of spreading a packaging adhesive over the spreading channel of a mask in accordance with the present invention.
Figure 3:
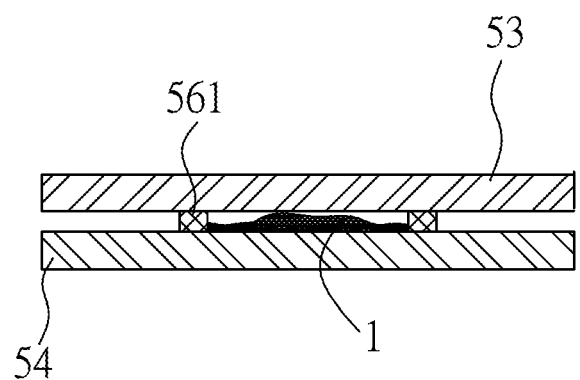
FIG. 3 is a cross-section view of a preferred embodiment of aligning and bolding an upper chip and a lower chip with each other in accordance with the present invention.

With reference to FIG. 1, FIG. 2 and FIG. 3 for a preferred embodiment of a chip packaging device applicable to packaging a liquid sample 1 in accordance with the present invention, the chip packaging device includes a main body unit 3, a packaging unit 5 and an aligning unit 7.

The main body unit 3 includes a mounting base 31, a holder 32 disposed above the mounting base 31, a rotational platform 33 connected to the holder 32 and a sliding platform 34 disposed on the rotational platform 33 to connect to the packaging unit 5; a vertical axis and a horizontal axis orthogonal to the vertical axis are defined in the mounting base. In addition, a horizontal axis 311 and a vertical axis 312 orthogonal to the horizontal axis 311 are defined in the mounting base 31.

The packaging unit 5 includes an upper bonding element 51 connected to the rotational platform 33, a lower bonding element 52 arranged in a regular interval and opposite to the upper bonding element 51, an upper chip 53 detachably disposed on one end of the upper bonding element 51, a lower chip 54 detachably disposed on one end of the lower bonding element 52, a mask 55 detachably disposed between the upper chip 53 and the lower chip 54, and an adhesive spreading can 56 connected to the rotational platform 33 and disposed at one side of the upper bonding element 51; besides, the adhesive spreading can 56 contains the packaging adhesive 561 for packaging the upper chip 53 and the lower chip 54.

Moreover, the vertical axis 312 is at the middle of the upper bonding element 51 and the lower bonding element 52, and the horizontal axis 311 is above the lower bonding element 52.

The upper chip 53 is disposed on the upper bonding element 51; the combination structure of the lower chip 54 disposed on the lower bonding element 52 may be a pin or notch; however, the combination structure is not the major technical feature of the present invention, so will not be described herein.

Preferably, the upper chip 53 and the lower chip 54 may be made of transparent materials; the area of the upper chip 53 is larger than or equal to the that of the lower chip 54. The type of the upper chip 53 and the lower chip 54 is not limited; in the embodiment, both of the length and the width of the upper chip 53 and the lower chip 54 is less than 3 cm. When actually implementing the present invention, the mask 55 can be a thin film attached to the surface of the lower chip 54; after the packaging adhesive 561 is spread, the thin-film mask 55 can be removed from the surface of the lower chip 54; in this way, the mask 55 can be conveniently separated from the lower chip 54.

Figure 4:
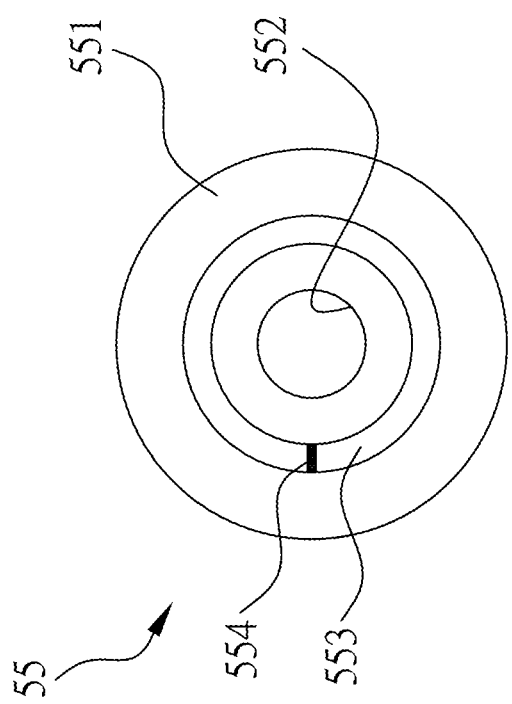
FIG. 4 is a top view of a preferred embodiment of the mask in accordance with the present invention.
Figure 5:
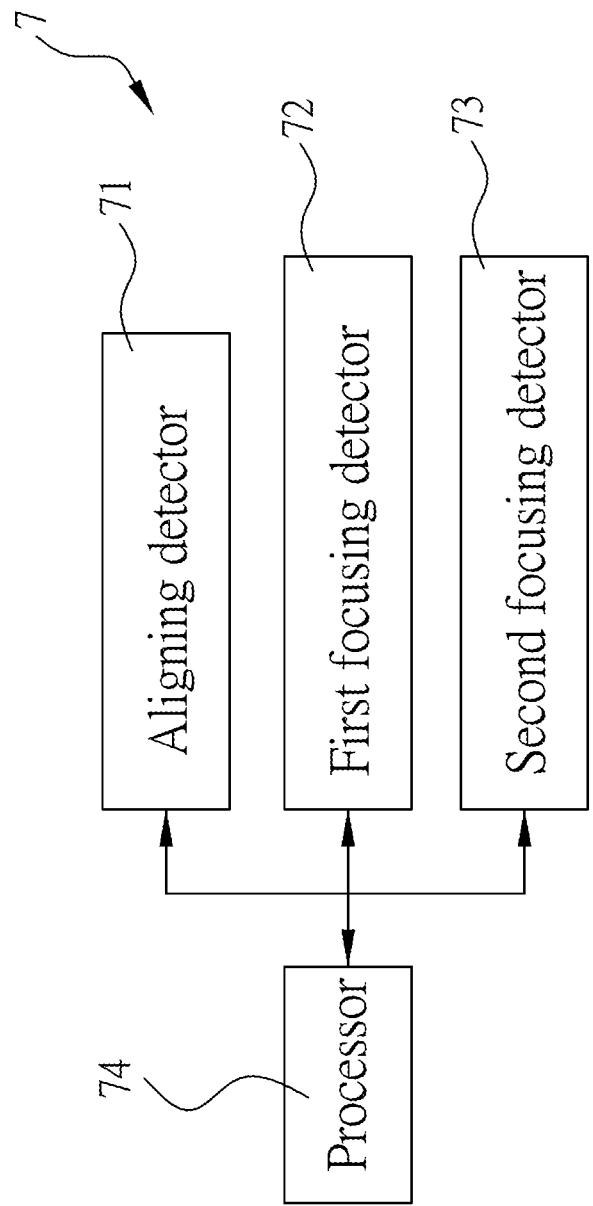
FIG. 5 is a block diagram of a preferred embodiment of the connection of an aligning unit in accordance with the present invention.

More specifically, the sliding platform 34 of the main body unit 3 is disposed on the rotational platform 33 in order to connect to the upper bonding element 51; the sliding platform 34 can move to drive the upper bonding element 51 to slide along an x-axis or a y-axis Please also refer to FIG. 4 and FIG. 5, the mask 55 has a main body 551, at least one placing hole 552 disposed on the main body 551, a spreading channel 553 surrounding the placing hole 552 and arranged in a regular interval therewith, and at least one connecting rid 554 connecting the spreading channel 553 to the main body 551. When the lower chip 54 and the mask 55 are disposed on the lower bonding element 52, the liquid sample 1 is in the placing hole 552 and the packaging adhesive 561 is spread in the spreading channel 553. After the mask 55 is removed, the upper chip 53 is pressed on the mask 55.

The present invention can adopt the high-viscosity adhesive to spread the sample and the mask 55 can be used to form pattern; besides, the material of the mask 55 may be polymer, metal, ceramic sheet, ceramic film, etc., so as to control the pattern and line width, and perform spreading for one time or several times. The form of the pattern of the liquid sample 1 can be designed according to the upper bonding element 51.

With the mask 55, the precision of spreading the packaging adhesive 561 can be increased. When actually implementing the present invention, it is possible to remove the connecting rib 554 and the spreading channel 553 can be replaced by a plurality of holes; in this way, the liquid packaging adhesive 561 can flow out from the holes in order to achieve the object of spreading the packaging adhesive 561. In the embodiment, the mask 55 is designed to have two rings; when actually implementing the present invention, the mask 55 can also be designed to have one pint in the center or several separated points; however, the above designs are just from example instead of limitations.

The aligning unit 7 includes an aligning detector 71 disposed at the middle of the upper bonding element 51 and above the vertical axis 312, a first focusing detector 72 disposed on the mounting base 31 and the horizontal axis 311, a second focusing detector 73 disposed on the mounting base 31 and the horizontal axis 311, and a processor. More specifically, the processor 74 is electrically connected to the aligning detector 71, the first focusing detector 72, the second focusing detector 73 and the sliding platform 34.

In the embodiment, the aligning detector 71 is an infrared laser and the area of the light emitted by the aligning detector 71 can be equal to the size of the spreading channel 553. If the area of the upper chip 53 is equal to the area of the lower chip 54, the distance of the area of the light emitted by the aligning detector 71 is equal to the peripheral of the upper chip 53 and the lower chip 54 so as to make the following position detection be more convenient. Further, the first focusing detector 72 and the second focusing detector 74 are cameras so as to perform the position detection for the edges of the upper chip 53 and the lower chip 54; then, the processor 74 can calculate the position of the focal length and the levelness of the upper chip 53 moving downward. Preferably, the first focusing detector 72 and the second focusing detector 73 are arranged to have an included angle equal to 90° therebetween in order to obtain multi-dimension view angle image. When actually implementing the present invention, it is possible to remove the first focusing detector 72 or the second focusing detector 73 so as to satisfy different requirements.

When the lower chip 54 and the mask 55 are disposed on the lower bonding element 52, place the liquid sample 1 in the placing hole 552, spread the packaging adhesive 561 over the surface of the liquid sample 1; then, remove the mask 55 and use the aligning detector 71, the first focusing detector 72 and the second focusing detector 73 to detect the position of the lower chip 54 to align and bond the upper chip 53 and the lower chip 54 so as to package the chips.

Take the view angle of FIG. 1 as an example, the aligning detector 71 can provide the view angle detections of the top and the bottom, the first focusing detector 72 can provide the view angle detections of the front and the rear, and the second focusing detector 73 can provide the view angle detections of the left and the right, which can better the precision of the alignment of the chips.

When the aligning detector 71, the first focusing detector 71 and the second focusing detector 72 perform the position detection for the lower chip 54 respectively, and keep performing the position detection after the upper chip 53 and the lower chip 54 are aligned and bonded with each other, the aligning detector 71 transmits a position signal to the processor 74 and the processor 74 controls the sliding platform 34 to move according to the position signal. Besides, the first focusing detector 72 and the second focusing detector 73 transmit an image signal to the processor 74 respectively in order to execute the focusing operation. Then, the processor 74 controls the sliding platform 34 to move according to the result of the focusing operation to align and bond the upper chip 53 and the lower chip 54 with each other. Furthermore, regarding the process of the processor 74 controlling the sliding platform 34 to move according to the result of the focusing operation, the processor 74 may record the image signals of the first focusing detector 72 and the second focusing detector 73 for the cross comparison of the focal length. During the above process, one of the processor 74, the first focusing detector 72 and the second focusing detector 73 or the combination thereof can be used to record the focal length after the focal length is determined so as to feedback the distance and the position of the liquid sample 1.

Figure 6:
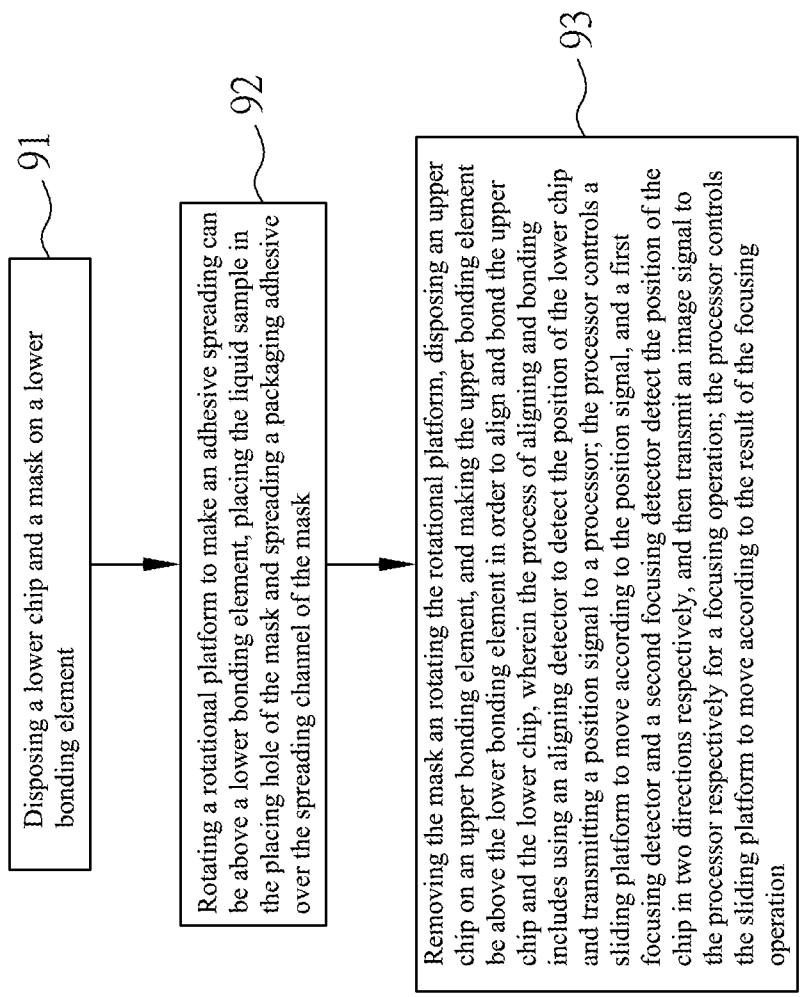
FIG. 6 is a flow chart of the steps of the alignment bonding method for chip packaging device in accordance with the present invention.

Please refer to FIG. 6, according to the above chip packaging device, the alignment bonding method for chip packaging device in accordance with the present invention includes the following steps:

The first step is the step 91: disposing the lower chip 54 and the mask 55 on the lower bonding element 52.

The second step is the step 92: rotating the rotational platform 33 to make the adhesive spreading can 56 be above the lower bonding element 52, placing the liquid sample 1 in the placing hole 552 of the mask 55 and spreading the packaging adhesive 561 over the spreading channel 553 of the mask 55.

More specifically, regarding the step 92, the viscosity of the liquid sample 1 is between 100~1,000,000 cp (centipoise), which can solve the problem that the conventional air-driven or pressure-driven adhesive spraying system may be difficult to spray the adhesive when the viscosity of the adhesive is more than 100 cp (centi-poise). In addition, the solid content of the liquid sample 1 is 0~80 wt %, such as particle, fiber, nanowire, flake, etc., and applicable to the transfer of a small amount of 0.78 pL~4 ml liquid sample; moreover, the color, conductivity, purify, secondary product, etc., of the sample are not limited.

Furthermore, regarding the step 92, the liquid sample 1 is disposed in the placing hole 552 of the mask 55 first, and then spread the packaging adhesive 561 over the spreading channel 553 of the mask 55. Therefore, the liquid sample 1 is in the inner ring of the mask 55 and the packaging adhesive 561 is in the outer ring thereof. During the above process, the liquid sample 1 is spread over the inner ring first and then the packaging adhesive 561 is spread over the outer ring, which can solve the problem that the liquid sample 1 spread latter contacts the packaging adhesive 561 spread first, or the packaging adhesive 561 in the outer ring is dried.

The final step is the step 93; remove the mask 55, rotate the rotational platform 33, dispose the upper chip 53 on the upper bonding element 51 and make the upper bonding element 51 be above the lower bonding element 52 so as to align and bond the upper chip 53 and the lower chip 54. The process of aligning and bonding includes using the aligning detector 71 to detect the position of the lower chip 54 and transmit a position signal to the processor 74; the processor 74 controls the sliding platform 34 to move according to the position signal, and the first focusing detector 72 and the second focusing detector 73 detect the position of the lower chip 54 in two directions respectively, and then transmit an image signal to the processor 74 respectively for the focusing operation; the processor 74 controls the sliding platform 34 to move according to the result of the focusing operation.

Besides, the upper chip 53 and the lower chip are made of transparent materials, so the light can pass through the middle of the upper chip 53 and the lower chip 54; thus, the aligning detector 71 can perform the position detection for the lower chip 54.

More specifically, the bonding pressure of the upper chip 53 and the lower chip 54 is lower than 1 KPA and the bonding time thereof is lower than 10 minutes and the bonding temperature thereof is lower than 100°. When actually implementing the present invention, the pressure can be applied according to the situation and then the feedback of the sensed temperature can also be provided. The height of the pattern of the packaging adhesive 561 between the upper chip 53 and the lower chip 54 is between 1000~1 um (Micrometer), the diameter thereof is between 1000~10 um and an average thickness difference thereof is lower than 50%.

Moreover, when implementing the post-treatment of sealing, the sealing pressure of the sealing adhesive is lower than 10 MPA, the sealing time is lower than 30 minutes and the sealing temperature is lower than 300°.

To sum up, according to the present invention, the structure and the cooperation relation between the main body unit 3, the packaging unit 5 and the aligning unit 7 can be applied to spread the sample by using high-viscosity adhesive. Besides, the mask 55 can be used to form pattern and the distance of the area of the light emitted by the aligning detector 71 is equal to the peripheral of the upper chip 53 and the lower chip 54 so as to make the following position detection be more convenient. Further, the aligning detector 71, the first focusing detector 72 and the second focusing detector 73 arranged to have an included angle equal to 90° therebetween can obtain the multi-dimension view angle image so as to package the upper chip 53 and the lower chip 54 by aligning and bonding so as to achieve the high-precision alignment. Thus, the desired technical effects of the present invention can be really realized.

The above disclosure is related to the detailed technical contents and inventive features thereof. Those skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A chip packaging device applicable to package a liquid sample and comprising:
    a main body unit, comprising a mounting base, a holder disposed above the mounting base and a rotational platform connected to the holder, wherein a vertical axis and a horizontal axis orthogonal to the vertical axis are defined in the mounting base;
    a packaging unit, comprising an upper bonding element connected to the rotational platform, a lower bonding element arranged in a regular interval and opposite to the upper bonding element, an upper chip detachably disposed on one end of the upper bonding element, a lower chip detachably disposed on one end of the lower bonding element and a mask detachably disposed between the upper chip and the lower chip, wherein the vertical axis is at a middle of the upper bonding element and the lower bonding element, and the horizontal axis is above the lower bonding element; and
    an aligning unit, comprising an aligning detector disposed at a middle of the upper bonding element and above the vertical axis, and a first focusing detector disposed on the mounting base and the horizontal axis, wherein when the lower chip and the mask are disposed on the upper bonding element, place the liquid sample in the mask and spread a packaging adhesive over a surface of the liquid sample; then, remove the mask, and use the aligning detector and the first focusing detector to detect a position of the lower chip respectively, whereby the upper chip and the lower chip are aligned and bonded with each other.

2. The chip packaging device of claim 1, wherein the aligning unit further comprises a second focusing detector disposed on the mounting base and the horizontal axis, and the first focusing detector and the second focusing detector are arranged to have an included angle equal to 90° therebetween.

3. The chip packaging device of claim 2, wherein the main body unit further comprises a sliding platform disposed on the rotational platform to connect to the upper bonding element; the sliding platform moves to drive the upper bonding element to slide along an x-axis or a y-axis; the aligning unit further comprises a processor connected to the aligning detector, the first focusing detector, the second focusing detector and the sliding platform; when the aligning detector, the first focusing detector and the second focusing detector are used to detect the position of the lower chip respectively, the aligning detector transmits a position signal to the processor and the processor controls the sliding platform according to the position signal; the first focusing detector and the second focusing detector transmits an image signal to the processor respectively for a focusing operation, and the processor controls the sliding platform to move according to a result of the focusing operation in order to align and bond the upper chip and the lower chip with each other.

4. The chip packaging device of claim 3, wherein the mask comprises a main body, a placing hole, a spreading channel surrounding the placing hole and arranged in a regular interval therewith, and at least one connecting rid connecting the spreading channel to the main body; when the lower chip and the mask are disposed on the lower bonding element, the liquid sample is in the placing hole, the packaging adhesive is spread in the spreading channel and the upper chip is pressed on the mask.

5. The chip packaging device of claim 4, wherein the packaging unit further comprises an adhesive spreading can connected to the rotational platform and disposed at one side of the upper bonding element; the adhesive spreading can contains the packaging adhesive for packaging the upper chip and the lower chip.

* * * * *